United States Patent

Tajima et al.

[11] Patent Number: 5,885,916
[45] Date of Patent: Mar. 23, 1999

[54] DIELECTRIC MATERIAL HAVING A LOW DIELECTRIC LOSS FACTOR FOR HIGH-FREQUENCY USE

[75] Inventors: Kenichi Tajima; Hideki Uchimura; Koichi Tanaka; Shoji Kohsaka; Hiroshi Maruyama, all of Kokubu, Japan

[73] Assignee: Kyocera Corporation, Kyoto, Japan

[21] Appl. No.: 931,499

[22] Filed: Sep. 16, 1997

Related U.S. Application Data

[62] Division of Ser. No. 636,121, Apr. 22, 1996, abandoned.

[30] Foreign Application Priority Data

Apr. 24, 1995 [JP] Japan .................................. 7-098684
Aug. 30, 1995 [JP] Japan .................................. 7-221299

[51] Int. Cl.$^6$ .......................... C04B 35/584; B32B 18/00
[52] U.S. Cl. ...................... 501/97.2; 501/97.1; 428/698; 428/699; 428/701
[58] Field of Search ................. 501/97.1, 97.2; 428/446, 698, 699, 701

[56] References Cited

U.S. PATENT DOCUMENTS

| | | | |
|---|---|---|---|
| 4,642,299 | 2/1987 | Hsieh ........................................ | 501/97 |
| 4,654,315 | 3/1987 | Hsieh ........................................ | 501/98 |
| 4,708,943 | 11/1987 | Hsieh et al. .............................. | 501/98 |
| 4,834,928 | 5/1989 | Su ............................................. | 264/56 |
| 5,399,536 | 3/1995 | Yamakawa et al. ..................... | 501/97 |

FOREIGN PATENT DOCUMENTS 204103  12/1986  European Pat. Off. .

OTHER PUBLICATIONS

Hideoki Fukushima, et al., "Measurement of Dielectric Properties of Ceramics at Microwave Frequency", pp. 61–66. (1987) no month.

*Primary Examiner*—Karl Group
*Attorney, Agent, or Firm*—Loeb & Loeb LLP

[57] ABSTRACT

A dielectric material having a low dielectric loss factor for high-frequency use, which comprises a sintered product of silicon nitride chiefly composed of silicon nitride and containing at least oxygen as an impurity component or oxygen as an impurity component and a compound of an element of the Group 3a of periodic table, wherein said sintered product contains aluminum in an amount which is not larger than 2% by weight reckoned as an oxide thereof having relative densities of not smaller than 97% and has a dielectric loss factor at 10 GHz of not larger than $5 \times 10^{-4}$. The dielectric material has excellent mechanical properties such as large strength and excellent chemical stability, features small dielectric loss factor in high-frequency regions, and is suited for use as a material for high-frequency oscillators, antennas, filters and electronic circuit boards. In particular, those dielectric materials are suited for use as window materials for introducing high frequencies in a high-frequency plasma-generating CVD apparatus, a microwave wave output unit and an oscillator.

5 Claims, 3 Drawing Sheets

DIELECTRIC MATERIAL HAVING A LOW DIELECTRIC LOSS FACTOR FOR HIGH-FREQUENCY USE

This is a division of application Ser. No. 08/636,121, filed on Apr. 22, 1996 now abandoned.

BACKGROUND OF THE INVENTION

1. Field of the Invention

The present invention relates to a dielectric material having a low dielectric loss factor for high-frequency use as employed in oscillators, antennas, filters and electronic circuit boards used in high-frequency regions such as in microwave and millimeter wave regions and, particularly, to a material for windows for transmitting high frequency such as of a high-frequency plasma-generating CVD device, a microwave output unit and an oscillator used in an apparatus for producing semiconductors, apparatus for producing liquid crystals, apparatus for producing photosensitive drums, apparatus for producing diamond films, and nuclear fusion apparatus.

2. Description of the Prior Art

In recent years, dielectric ceramics for high-frequency use have been positively used as electronic components and electronic circuit boards in high-frequency regions accompanying the development and widespread use of mobile communication equipment such as cordless telephones, simple portable telephone systems (PHS), satellite broadcast receivers, as well as high-frequency equipment and devices such as CVD apparatus for producing semiconductors and liquid crystals.

From the standpoint of enhancing performance, the dielectric materials used in high frequencies must exhibit small dielectric losses at high frequencies. Accompanying the modern trend toward adapting high-frequency technology to general applications, furthermore, study has been forwarded to utilize dielectric materials under special environmental conditions such as high-temperature and corrosive conditions. It has therefore been urged to provide a dielectric material having a low dielectric loss factor for use in high frequencies featuring excellent mechanical properties, chemical stability and high reliability.

Conventional dielectric ceramic materials of the types of $BaO\text{-}TiO_2$, $MgO\text{-}CaO\text{-}TiO_2$ and $CaO\text{-}ZrO_2$ having excellent dielectric properties are not yet satisfactory in regard to their mechanical properties and chemical stability. Though a variety of attempts have been made in order to improve such properties, their strengths are about 100 MPa at the greatest. Besides, the mechanical and chemical properties vary to a large extend depending upon the Young's modulus specific to the material, mode of interatomic bonding and bonding force, leaving much room for improvements.

Ceramics having excellent mechanical and chemical properties can be represented by a sintered product of silicon nitride. According to the journal of the Japanese Association of Precision Engineering, Vol. 53, No. 5, 1987, pp. 743–748, however, the sintered product of silicon nitride used for general mechanical parts exhibits a dielectric loss factor of as large as $7 \times 10^{-4}$ at a frequency of 6 GHz, and is not applicable as a dielectric material for high-frequency use. So far, silicon nitride has seldom been studied as a dielectric material.

Recently, furthermore, a microwave plasma processing apparatus has been much used chiefly in the CVD, etching and resist steps in the production of semiconductors, liquid crystals and thin films. In a high frequency generator e.g., gryotron) used for nuclear fusion, furthermore, millimeter waves in excess of 20 GHz are output and are introduced into the nuclear fusion furnace to generate a plasma of high energy.

A window transmitting high-frequency waves constituted by a material having good high-frequency permeability is used for the high-frequency introduction portion and output portion of the apparatus that generates plasma using high frequencies such as microwaves or millimeter waves. Such an introduction window and an output window (hereinafter referred to as transmitting windows), however, must have high-frequency transmission properties (low dielectric constant, low dielectric loss) as well as heat resistance to withstand a rise of temperature and a rapid change in temperature, thermal shock resistance and air-tightness for maintaining vacuum. In recent years, it has been urged to provide production apparatus featuring high productivity. In order to accomplish nuclear fusion, furthermore, a plasma of a high temperature must be produced requiring large electric power of high frequencies. Therefore, it has been demanded to provide windows having higher performance and higher reliability to meet such tendencies.

These windows have heretofore been composed of a quartz glass, alumina ceramics, single crystalline alumina (sapphire), aluminum nitride (AlN) or beryllia (BeO) having low dielectric constant, small dielectric loss and high density by giving importance to high-frequency transmission properties and air-tightness for maintaining vacuum.

However, these materials all have poor thermal shock resistance. When a large electric power of a high frequency is transmitted, furthermore, the window is locally heated giving rise to the occurrence of cracks or pinholes due to melting, resulting in a decrease in the air-tightness for maintaining vacuum.

In order to solve these problems, the surfaces of the windows have been coated with, for example, a film of TiN or a film having high thermal conductivity from the standpoint of preventing an increase in temperature on the surfaces of the windows. Or, it has been proposed, from the standpoint of increasing strength, to produce a window material using alumina ceramics as disclosed in, for example, Japanese Laid-Open Patent Publication No. 345527/1994 or using an alumina-zirconia composite material as disclosed in Japanese Laid-Open Patent Publication No. 280976/1992. These ceramics, however, have a thermal shock resistance of as low as about 200 to 300° C., which is not sufficient from the standpoint of reliability. Besides, cracks easily develop in the windows impairing mechanical reliability and making it difficult to dear with large electric power at high frequencies.

There has further been known a silicon nitride ($Si_3N_4$) ceramics materials used for which exhibits far superior heat resistance, thermal shock resistances and mechanical properties to those of the above-mentioned ceramics. However, the silicon nitride has been used as structural components but has not been studied in regard to being used as a window material for introducing high frequencies by reason of having a high dielectric loss.

In order to obtain a material having a high strength and a low dielectric loss factor in a high-frequency band, the present inventors have forwarded the study extensively to decrease dielectric loss by using a sintered product of silicon nitride that has excellent mechanical and chemical properties but a large dielectric loss factor. As a result, the inventors have discovered the fact that the dielectric loss factor at 10

GHz can be decreased down to not larger than $5 \times 10^{-4}$ if the content of aluminum that is inevitably contained as impurities in the sintered product of silicon nitride is suppressed to be smaller than a predetermined amount and that there can be obtained an excellent material having a small dielectric loss factor that is suited for use in high frequencies, and have thus arrived at the present invention.

The inventors have further discovered the fact that particularly excellent properties are obtained when a material of the present invention is used and, particularly, when a material of the invention having a relative density of not smaller than 97% and a dielectric loss factor of not larger than $5 \times 10^{-4}$ is used as a window for high frequencies such as in the aforementioned CVD apparatus, microwave output unit and oscillator.

SUMMARY OF THE INVENTION

According to the present invention, there is provided a dielectric material having a low dielectric loss factor for high-frequency use, which comprises a sintered product of silicon nitride chiefly composed of silicon nitride and containing at least oxygen as an impurity component or oxygen as an impurity component and a compound of an element of the Group 3a of periodic table, wherein said sintered product contains aluminum in an amount which is not larger than 2% by weight reckoned as an oxide thereof relative density>97%, and has a dielectric loss factor at 10 GHz of not larger than $5 \times 10^{-4}$.

According to the present invention, furthermore, there is provided a material having a relative density of not smaller than 97% and being suited for use as a window for introducing high frequencies.

The dielectric material for high-frequency use of the present invention contains chiefly silicon nitride as well as oxygen as an impurity component or oxygen as an impurity component and a compound of an element of the Group 3a of periodic table. By suppressing the amount of aluminum in the dielectric material to be not larger than 2% by weight reckoned as an oxide thereof, the inventors have succeeded in suppressing the dielectric loss factor to be not larger than $5 \times 10^{-4}$ at 10 GHz.

In particular, the amount of aluminum greatly affects the dielectric loss of the dielectric material. Though the reason is not clear why the presence of aluminum increases the dielectric loss, it has been known that aluminum usually solid-dissolves in silicon nitride to form Sialon (Si-Al-O-N) to decrease thermal conductivity and, at the same time, forms a low-melting composition on the grain boundaries to deteriorate mechanical strength at high temperatures. It is therefore presumed that Sialon or the low-melting composition greatly affects the dielectric loss characteristics.

The dielectric material of the present invention exhibits a dielectric loss factor (tan δ) of not larger than $5 \times 10^{-4}$ even at a high frequency of 10 GHz and features a strikingly increased strength compared with that of the dielectric materials known thus far. Therefore, the dielectric material of the present invention is suited for use in oscillators, antennas, filters and as electronic circuit boards used under severe conditions in high-frequency bands of microwaves and millimeter waves of from several hundred MHz to 300 GHz and, particularly, from 1 GHz to 100 GHz. Use of such a dielectric material makes it possible to provide electronic components for high-frequency use featuring high reliability.

When the dielectric material of the present invention is used as a window for transmitting high frequencies and, particularly, when the dielectric material having a relative density of not smaller than 97% is used as a window material, there are exhibited far superior thermal shock resistance and heat resistance to those of the conventional window materials of this kind.

Moreover, the dielectric material of the present invention coated on its surfaces with a ceramic film such as of alumina, silicon nitride or zirconia, exhibits extremely excellent properties such as resistance against corrosion caused by plasma, and the like properties.

DETAILED DESCRIPTION OF THE PREFERRED EMBODIMENT

Figure 1:
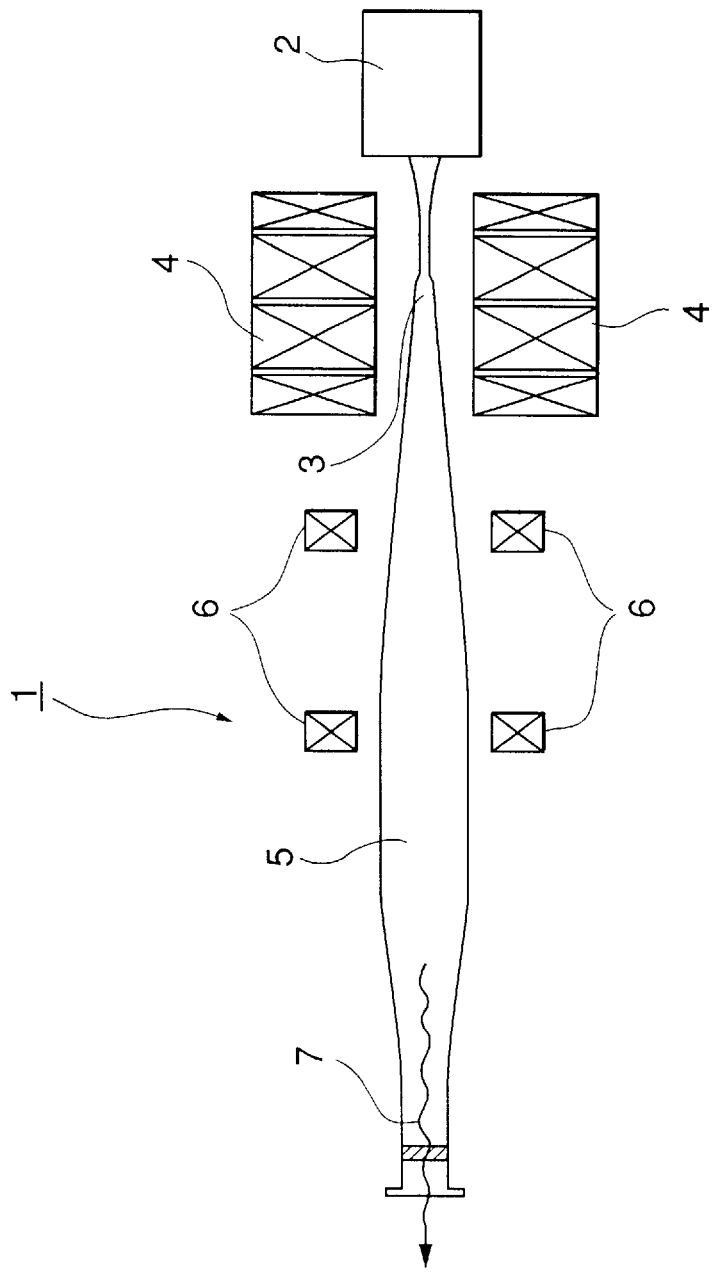
FIG. 1 is a diagram schematically illustrating a gyrotron microwave oscillator.

The invention will now be described in detail.

According to the present invention, the dielectric material is composed of chiefly silicon nitride and at least oxygen as an impurity component or oxygen as an impurity component and a compound of an element of the Group 3a of periodic table. Here, oxygen as an impurity component stands for a silicon dioxide ($SiO_2$) component which is one of many oxides contained in the sintered product of silicon nitride. Oxygen as an impurity stems from impurity oxygen inevitably contained in the starting material of silicon nitride or from silicon oxide ($SiO_2$) that is intentionally added.

A compound of an element of the Group 3a of periodic table is added as a sintering aid. Examples of this compound include those of Y, La, Ce, Sm, Dy, Ho, Er, Yb, Lu and Sc. Among them, it is desired to use a compound of Er, Yb or Lu having a small ionic radius from the standpoint of strength. Among them, it is particularly desired to use Lu. It is desired that the compound of the element of the Group 3a of period table is used in an amount of not larger than 10 mol % reckoned as an oxide thereof and, more preferably, not larger than 3 mol %. It is desired that the content of oxygen as an impurity component, i.e., the content of silicon dioxide is from 1.5 to 10 and, particularly, from 1.8 to 3.5 in terms of a molar ratio ($SiO_2/RE_2O_3$) relative to the amount of the compound of the element of the Group 3a of periodic table reckoned as an oxide ($RE_2O_3$) thereof.

In general, this kind of sintered product inclusive of the sintered product of the present invention inevitably contains aluminum compounds as impurity components. In the present invention, however, it is particularly important to suppress the content of the aluminum compound to be not larger than a particular amount.

The content of aluminum (Al) in the sintered product is a major factor for determining the dielectric loss of the sintered product, and the dielectric loss decreases with a decrease in the amount of aluminum.

In the present invention, therefore, it is important that the amount of aluminum is not larger than 2% by weight reckoned as an oxide ($Al_2O_3$) thereof and, particularly, not larger than 0.5% by weight and nor larger than 0.1% by weight. When the amount of aluminum exceeds 2% by weight, a sintered product of low loss factor cannot be obtained.

In addition to satisfying the amount of aluminum as described above, the dielectric material of the present invention may contain trace amounts of alkaline earth metals, molybdenum and composite particles such as of a tungsten compound.

There is no particular limitation in the density of the dielectric material of the present invention provided it is dense enough as a sintered product. From the standpoint of the mechanical strength, however, it is desired that the relative density is not smaller than 97% and, particularly, not smaller than 98%. From the standpoint of the microstructure, the dielectric material consists of silicon nitride particles and grain boundary phase thereof. The compound of the element of the Group 3a of periodic table and oxygen as an impurity component form a glass phase or a crystalline phase to constitute grain boundary of the sintered product. As for the crystalline phase, the silicon nitride product. As for the crystalline phase, the silicon α-type or the β-type. From the standpoint of increasing the mechanical strength at high temperatures, it is desired that the grain boundary phase has been crystallized.

As for the cationic impurities, there is no particular limitation provided the amount of aluminum lies within the above-mentioned range. From the standpoint of strength, it is desired that the amount of aluminum is small. It is desired that the total amount of transition metals such as Fe, Ni, Zn, etc. is not larger than 1% by weight and, preferably, not larger than 0.5% by weight reckoned as oxides thereof. There is no problem if the amounts of fluorine (F) and chlorine (Cl) adsorbed by the starting material of silicon nitride are those of the level of the silicon nitride powder that is placed in the market, i.e., are not larger than 0.1% by weight. However, smaller amount is better. Alkali metals such as Na and K may affect the dielectric loss if their amounts are too large. It is therefore desired that the amount of alkali metals is not larger than 0.1% by weight.

When the dielectric material having a low dielectric loss factor for high-frequency use of the present invention is used as a window for transmitting high frequencies, it is particularly desired that the dielectric material has a relative density of not smaller than 97%. Use of such a material makes it possible to greatly improve thermal shock resistance, mechanical strength and air-tightness to maintain vacuum. Use of the dielectric material having a relative density of not smaller than 97% makes it possible to completely preclude such troubles as cracking of the introduction windows, etc.

It is further desired that the relative density is not smaller than 98% from the standpoint of thermal shock resistance, strength and air-tightness for maintaining vacuum.

It is desired that the material used for this embodiment has a strength of not smaller than 500 MPa and a thermal shock resistance which is not deteriorated even when the dielectric material is quickly quenched by 500° C.

The window for transmitting high frequencies composed of the dielectric material of the present invention is coated on its surfaces with at least one ceramic film selected from the group consisting of alumina ($Al_2O_3$), aluminum nitride (AlN) and zirconia ($ZrO_2$). The window material of the present invention coated with such a film exhibits excellent resistance against plasma etching, and is particularly suited for use as a window material for apparatus used in the step of etching in the production of semiconductors and liquid crystals by using a CF or Cl gas where an F plasma or a Cl plasma generates.

The thickness of the film is from 50 to 200 μm and, particularly, from 50 to 100 μm. When the thickness is smaller than this range, only small resistance is exhibited against the etching by plasma. When the thickness is larger than this range, the dielectric loss increases, i.e., transmission property in high frequencies is deteriorated. The film can be formed by any known method such as CVD method, PVD method or plasma melt-injection method. It is desired that the ceramic film is crystallized. When used as a window member, in particular, it is desired that there exists neither poor adhesion nor gaps in the boundary between the ceramic film and the dielectric material. The presence of such gaps may cause high frequency electromagnetic waves to vary across the gaps or their energy to be concentrated in the gaps, seriously affecting the transmission of electromagnetic waves. It is further desired that the film has a uniform thickness and less defect. It is important that there remains no organic compound that may evaporate under a highly evacuated condition.

In forming the film, the surfaces of the dielectric material should be coarsened by being blasted with sand so that the dielectric material exhibits anchoring effect for the film. In this case, the film can be intimately adhered to the dielectric material. When, for instance, the film is formed by a plasma melt-injection method, it is desired to employ a reduced-pressure plasma melt-injection method in order to form a film having a porosity of not larger than 10%.

A concrete example of using the dielectric material having a low dielectric loss factor of the present invention will now be described with reference to the drawings. FIG. 1 is a diagram schematically illustrating a gyrotron which is a microwave oscillator. In the gyrotron 1 of FIG. 1, an electron gun 2 generates electrons which cause an electron cyclotron resonance to take place in a cavity 3 due to main magnet coils 4, and electromagnetic waves (microwaves or millimeter waves) of a predetermined frequency are induced and radiated. The electrons are collected by collector magnet coils 6 in a beam collector area 5 which is maintained a vacuum. The electromagnetic waves (microwaves, millimeter waves) that are induced and radiated are output through an output window 7. According to the present invention, the output window 7 in the gyrotron of FIG. 1 is constituted by the dielectric material having a low dielectric loss factor of the present invention. With the output window 7 being constituted by the dielectric material having a high strength and a low dielectric loss factor of the present invention, the microwaves of a large output passing through the window are not lost so much and the vacuum is maintained in the beam collector area 5.

Figure 2:
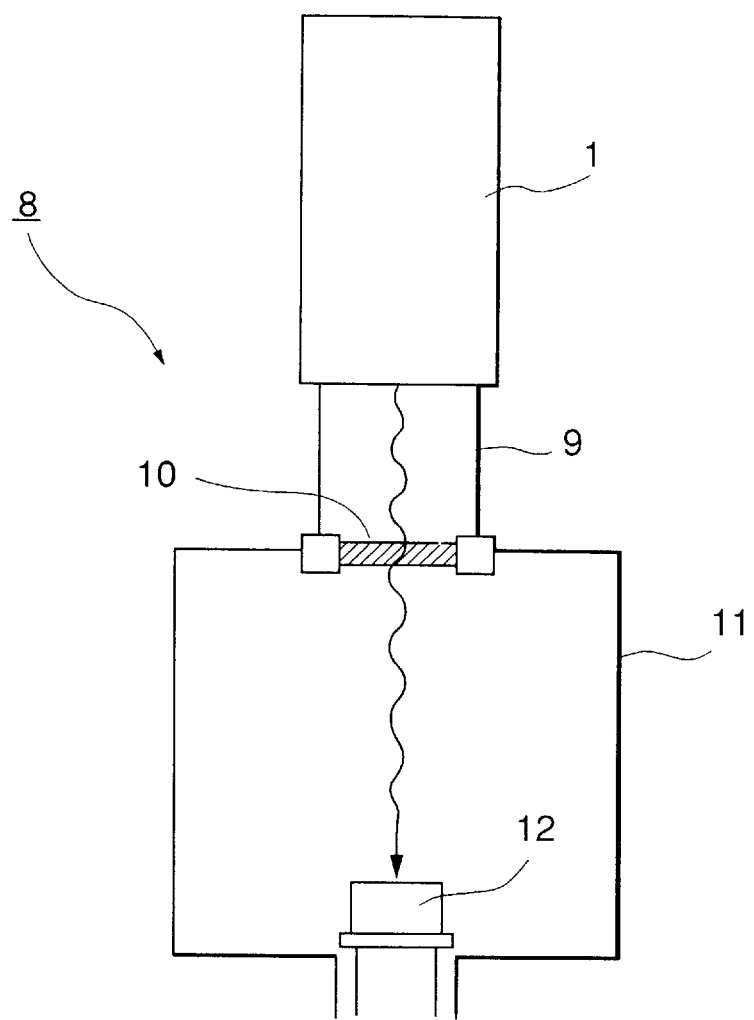
FIG. 2 is a diagram schematically illustrating a microwave heating apparatus equipped with the oscillator of FIG. 1.

FIG. 2 is a diagram schematically illustrating a microwave heating apparatus on which the microwave oscillator of FIG. 1 is mounted. By using the heating apparatus 8 of FIG. 2, the microwaves generated from the microwave oscillator 1 are introduced into a heating chamber 11 passing through a waveguide 9 and a microwave introduction window 10. A material 12 to be heated is placed in the heating chamber, is irradiated with microwaves and is heated.

According to the present invention, the microwave introduction window 10 in FIG. 2 is constituted by using the dielectric material having a low dielectric loss factor of the present invention. Even when microwaves of a large output and a high frequency are introduced and the heating chamber is maintained at a high temperature, the window member is not cracked. Moreover, the microwaves can be introduced into the heating apparatus without loss of microwaves.

Figure 3:
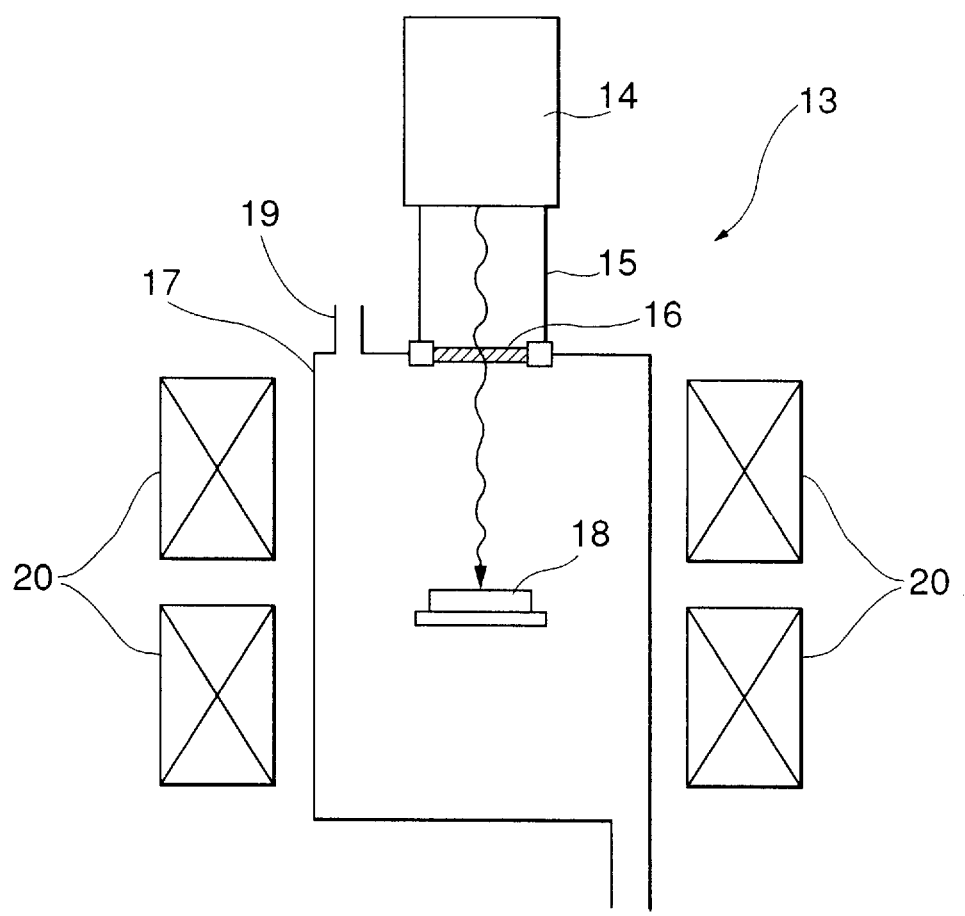
FIG. 3 is a diagram schematically illustrating an electron cyclotron resonance plasma CVD apparatus.

FIG. 3 is a diagram schematically illustrating an electron cyclotron resonance plasma CVD apparatus. In this CVD apparatus 13, the microwaves generated from the microwave oscillator 14 are introduced into a reaction chamber 17 passing through a waveguide 15 and a microwave introduction window 16. A material 18 to be treated is placed in the reaction chamber 17. A reaction gas is introduced into the reaction chamber 17 through a gas introduction port 19 and is irradiated with microwaves. Besides, a magnetic field is applied by magnet coils 20 in order to generate an electron cyclotron resonance plasma of the reaction gas in the reaction chamber 17. Therefore, the gas is efficiently dissociated, and a desired film is homogeneously formed on the surface of the material 18 to be treated.

Even in this CVD apparatus, the microwave introduction window 16 is constituted by using the dielectric material having a low dielectric loss factor of the present invention. Even when the reaction chamber is heated at a high temperature, therefore, the microwaves can be efficiently introduced without loss of microwaves. Therefore, the plasma is stabilized within a short period of time, and the film is formed at an increased rate.

To obtain the dielectric material of the present invention, silicon nitride containing aluminum in a small amount is used as a starting material and compounds such as silicon oxide or an oxide of an element of the Group 3a of periodic table are further added to the silicon nitride. The starting material is then molded into any shape such as a block or a sheet by any desired molding means such as mold press, cold isostatic pressure press, extrusion molding or doctor blade method, followed by sintering.

It is essential that the sintering is effected under the conditions for suppressing the decomposition of silicon nitride. Any widely known sintering method can be employed such as pressureless sintering process, a nitrogen pressure sintering process or a not isostatic press sintering process. The sintering temperature is within a range of from 1600 to 2000° C. though it may vary with the composition, and the sintering is performed such that a relative density of not smaller than 90% is accomplished.

When the dielectric material of the present invention is used as a window material for transmitting high frequencies, any one of the above-mentioned molding means is employed to effect the molding, and the molded article is cut into the shape of a introduction window followed by sintering.

EXAMPLES
(Example 1)

Three kinds of starting materials (having BBT specific surface areas of not smaller than 8 $m^2/g$, average particle diameters of 2 to 5 $\mu m$) were prepared, i.e., a high-purity silicon nitride starting material (total amount of transition metal impurities is not larger than 100 ppm; amount of aluminum is not larger than 20 ppm; starting material A) having an α-ratio of 95% as produced by an imide decomposition method, a silicon nitride starting material (total amount of transition metal impurities is not larger than 1000 ppm, amount of aluminum is not larger than 200 ppm; starting material B) having an α-ratio of 90% as produced by a direct nitrogenation method, and a low-purity silicon nitride starting material (total amount of transition metal impurities is not larger than 10000 ppm, amount of aluminum is not larger than 1000 ppm; starting material C) having an α-ratio of 70% as produced by the direct nitrogenation method.

As sintering aids, there were used fine powdery $Al_2O_3$, $SiO_2$ and oxide ($RE_2O_3$) of an element of the group 3a of periodic table having purities of not smaller than 99.9% in amounts as shown in Tables 1 and 2. Among them, $SiO_2$ included those in which oxygen as an impurity component in the starting silicon nitride was reckoned as $SiO_2$. The predetermined amounts of powders were introduced a 500-ml pot made of a polyethylene, and were mixed and pulverized in a rotary mill for 72 hours by using urethane balls and IPA (isopropanol) as an organic solvent. A binder was added to the thus obtained slurry which was then spray-dried to obtain a granulated powder. The powder was molded using a metal mold press under a molding pressure of 1 ton/$cm^2$ into an article having a diameter of 20 mm and a thickness of 10 mm and an article measuring 5×6×45 mm for measuring the strength. The molded articles were dewaxed at 500° C. to obtain samples for sintering.

The sintering was effected in three ways, i.e., in nitrogen under a pressure of 1.2 atms. at 1750° C. for 5 hours (PLS method), and after sintering by the PLS method, in nitrogen under a pressure of 9 atms. at 1850° C. for 5 hours (GPS), and by burying the molded article in a glass bath under a hot isostatic press in argon of a pressure of 2000 atms. at 1950° C. for 3 hours (HIP).

It was confirmed that the samples possessed relative densities of not smaller than 95%. The samples were subjected to the cylindrical and flat-surface grinding to obtain samples of a diameter of 15 mm and a thickness of 7 mm for measuring dielectric loss factors and to obtain JIS testing pieces (3×4×35 mm) for measuring strength and other properties. The dielectric loss was measured by a cylindrical resonance measuring method at a resonance frequency of 10 GHz. After the measurement, the central portions of the samples were cut out, and the amounts of aluminum were measured from the ICP analysis and were reckoned as alumina ($Al_2O_3$). Through the X-ray analysis of the powders, furthermore, crystalline phases other than the silicon nitride crystalline phase were identified. The mechanical strengths were measured by a four-point bending test in compliance with JIS R 1601. The relative densities were evaluated from the theoretical density ratios calculated from the starting composition and bulk densities measured by the Arckimedes methods. The results were as shown in Tables 1 and 2.

TABLE 1

| Sample No. | Starting $Si_3O_4$ | Additives $RE_2O_3$ | $SiO_2$ | Amount of additive $Al_2O_3$ (wt %) | Sintering method | Amount of Al (wt %) | Dielectric loss factor ×$10^{-4}$ | Strength at room temp. (Mpa) | Crystalline phase | Relative density (%) |
|---|---|---|---|---|---|---|---|---|---|---|
| 1-1 | A | $Yb_2O_3$ | 3 | 10 | 0 | GPS | <0.1 | 2.0 | 710 | R2S,SNO | 99 |
| 1-2 | A | $Er_2O_3$ | 3 | 6 | 0 | GPS | <0.1 | 2.4 | 690 | R2S,RS | 99 |
| 1-3 | A | $Lu_2O_3$ | 3 | 6 | 0 | GPS | <0.1 | 0.7 | 760 | R2S,RS | 99 |
| 1-4 | A | $Y_2O_3$ | 3 | 6 | 0 | GPS | <0.1 | 2.7 | 700 | R2S,RS | 99 |
| 1-5 | A | $Dy_2O_3$ | 3 | 6 | 0 | GPS | <0.1 | 3.0 | 700 | R2S,RS | 99 |

TABLE 1-continued

| Sample No. | Starting $Si_3O_4$ | Additives $RE_2O_3$ | | $SiO_2$ | Amount of additive $Al_2O_3$ (wt %) | Sintering method | Amount of Al (wt %) | Dielectric loss factor ×$10^{-4}$ | Strength at room temp. (Mpa) | Crystalline phase | Relative density (%) |
|---|---|---|---|---|---|---|---|---|---|---|---|
| 1-6 | A | $Er_2O_3$ | 1 | 10 | 0 | GPS | <0.1 | 1.9 | 770 | R2S,SNO | 99 |
| 1-7 | B | $Yb_2O_3$ | 3 | 4.5 | 0 | GPS | 0.1 | 3.3 | 790 | Y, A | 99 |
| 1-8 | B | $Yb_2O_3$ | 5 | 10 | 0 | GPS | 0.1 | 3.6 | 750 | R2S, A | 99 |
| 1-9 | B | $Y_2O_3$ | 4 | 10 | 0 | GPS | 0.1 | 3.8 | 700 | R2S,SNO | 99 |
| 1-10 | B | $Y_2O_3$ | 4 | 10 | 1.0 | PLS | 1.1 | 4.2 | 730 | R2S, A | 98 |
| 1-11 | B | $Y_2O_3$ | 4 | 10 | 1.5 | PLS | 1.5 | 4.7 | 750 | R2S, A | 98 |
| 1-12 | B | $Y_2O_3$ | 4 | 10 | 2.0 | PLS | 1.9 | 5.0 | 790 | g | 98 |
| 1-*13 | B | $Y_2O_3$ | 4 | 10 | 2.5 | PLS | 2.4 | 6.8 | 850 | g | 98 |
| 1-*14 | B | $Y_2O_3$ | 4 | 10 | 4.0 | PLS | 3.8 | 8.6 | 880 | g | 98 |
| 1-*15 | C | $Y_2O_3$ | 3 | 5 | 0 | PLS | 0.2 | 4.0 | 450 | Y, A | 95 |
| 1-*16 | C | $Y_2O_3$ | 3 | 5 | 2.0 | PLS | 2.1 | 7.2 | 550 | g | 97 |
| 1-*17 | C | $Y_2O_3$ | 3 | 5 | 5.0 | PLS | 5.1 | 9.6 | 590 | g | 97 |
| 1-18 | A | no addition | | 10 | 0 | HIP | <0.1 | 1.2 | 790 | g | >99 |
| 1-*19 | A | no addition | | 10 | 3.0 | HIP | 2.9 | 5.9 | 810 | g | >99 |
| 1-20 | B | no addition | | 10 | 0 | HIP | <0.1 | 2.0 | 850 | g | >99 |
| 1-21 | C | no addition | | 10 | 0 | HIP | 0.2 | 3.5 | 650 | g | >99 |

Samples marked with * lie outside the scope of the invention.
Note:
Amount of Al is in the sintered product and as been reckoned is $Al_2O_3$. R2S is $RE_2Si_2O_7$, RS is $RE_2SiO_5$, SNO is $Si_2N_2O$, A is apatite, Y is YAM, g is glass (amorphous).

TABLE 2

| Sample No. | Starting $Si_3O_4$ | Additives $RE_2O_3$ | | $SiO_2$ | Amount of additive $Al_2O_3$ (wt %) | Sintering method | Amount of Al (wt %) | Dielectric loss factor ×$10^{-4}$ | Strength at room temp. (Mpa) | Crystalline phase | Relative density (%) |
|---|---|---|---|---|---|---|---|---|---|---|---|
| 1-22 | A | $Lu_2O_3$ | 1 | 10 | 0 | GPS | <0.1 | 0.6 | 880 | R2S | 99 |
| 1-23 | D | $Lu_2O_3$ | 1 | 10 | 0 | GPS | <0.1 | 1.9 | 780 | R2S | 99 |
| 1-24 | C | $Lu_2O_3$ | 1 | 10 | 0 | GPS | 0.2 | 3.6 | 670 | R2S | 99 |
| 1-25 | A | $Lu_2O_3$ | 3 | 4.5 | 0 | GPS | <0.1 | 1.0 | 890 | Y, A | 99 |
| I-26 | A | $Lu_2O_3$ | 3 | 10 | 0 | GPS | <0.1 | 0.5 | 850 | R2S,SNO | 99 |
| 1-27 | A | $Lu_2O_3$ | 3 | 15 | 0 | GPS | <0.1 | 0.5 | 830 | R2S,SNO | 99 |
| 1-28 | A | $Lu_2O_3$ $Yb_2O_3$ | 1.5 1.5 | 10 | 0 | GPS | <0.1 | 0.5 | 850 | R2S,SNO | 99 |
| 1-29 | A | $Lu_2O_3$ | 7 | 20 | 0 | GPS | <0.1 | 1.2 | 820 | R2S,SNO | 99 |
| 1-*30 | A | no additive | | 10 | 0 | GPS | <0.1 | 1.1 | 400 | SNO | 95 |
| 1-*31 | B | no additive | | 10 | 0 | GPS | <0.1 | 1.1 | 450 | SNO | 96 |
| 1-32 | C | no additive | | 10 | 0 | GPS | 0.2 | 3.1 | 550 | SNO | 97 |
| 1-33 | A | $Lu_2O_3$ | 7 | 10 | 2 | PLS | 1.9 | 4.1 | 630 | R2S,SNO | 98 |

Samples marked with * lie outside the scope of the invention.
Note:
Amount of Al is in the sintered product and as been reckoned is $Al_2O_3$. R2S is $RE_2Si_2O_7$, RS is $RE_2SiO_5$, SNO is $Si_2N_2O$, A is apatite, Y is YAM, g is glass (amorphous).

As will be obvious from Tables 1 and 2, the samples Nos. 1-13, 1-14, 1-16, 1-17 and 1-19 in which the amounts of aluminum exceed 2% by weight reckoned as oxides exhibit sufficiently large strengths but also exhibit dielectric loss factors of not smaller than $5 \times 10^{-4}$. The dielectric materials of the present invention in which the amounts of aluminum are not larger than 2% by weight, on the other hand, exhibit dielectric loss factors of not larger than $5 \times 10^{-4}$ as measured at a frequency as high as 10 GHz and exhibit strengths at room temperature of not smaller than 500 MPa and, particularly, not smaller than 600 MPa. In particular, when the amount of aluminum is not larger than 0.5% by weight reckoned as an oxide, the dielectric loss factor becomes not larger than $4 \times 10^{-4}$ and when the amount of aluminum is not larger than 0.1% by weight, the dielectric loss factor becomes not larger than $3 \times 10^{-4}$.

(Example 2)

The same starting materials A, B, C and sintering aids as those of Example 1 were prepared and were weighed in amounts as shown in Tables 3 and 4.

The weighed powders were treated in the same manner as in Example 1 to prepare samples for sintering.

The sintering was effected in two ways, i.e., in nitrogen under a pressure of 1.2 atms. at 1750° C. for 5 hours (PLS method), and after sintered by the PLS method, in nitrogen under a pressure of 9 atms. at 1850° C. for 5 hours (GPS).

It was confirmed that the samples possessed relative densities of not smaller than 94%. The samples were subjected to the cylindrical and flat-surface grinding to obtain samples of a diameter of 15 mm and a thickness of 7 mm for measuring dielectric loss factors and to obtain JIS testing pieces (3×4×35 mm) for measuring strength and other properties. The dielectric loss was measured by a cylindrical resonance measuring method at a resonance frequency of 10

GHz. After the measurement, the central portions of the samples were cut out, and the amounts of aluminum were measured from the ICP analysis and were reckoned as alumina ($Al_2O_3$). Through the X-ray analysis of the powders, furthermore, crystalline phases other than the silicon nitride crystalline phase were identified. The relative densities were evaluated from theoretical density ratios calculated from the starting compositions and the bulk densities measured by the Archimedes' method. The strengths were measured by a four-point bending test in compliance with JIS R 1601. The results were as shown in Tables 3 and 4.

tested durability of the introduction window. The ECR plasma CVD apparatus that was used was the one for synthesizing diamond in gaseous phase, and the degree of vacuum was $1\times10^{-4}$ Pa, plasma turn-on pressure was 1 Pa, microwave frequency was 2.45 GHz, and a maximum electric power for producing microwaves was 5 KW. The introduction window was of a shape of a diameter of 130 mm and a thickness of 16 mm.

The films were formed by using a methane gas diluted with hydrogen, a single crystalline silicon wafer was used as a substrate for depositing the films, and microwaves of 5 KW were introduced into the apparatus through the intro-

TABLE 3

| Sample No. | Starting $Si_3O_4$ | Additives $RE_2O_3$ | | $SiO_2$ | Amount of additive $Al_2O_3$ (wt %) | Sintering method | Amount of Al (wt %) | Dielectric loss factor $\times10^{-4}$ | Relative density (%) | Strength at room temp. (Mpa) | Crystalline phase |
|---|---|---|---|---|---|---|---|---|---|---|---|
| 2-1  | A | $Yb_2O_3$ | 3 | 10  | 0    | GPS | <0.1 | 2.0  | >99 | 710 | R2S, SNO |
| 2-2  | A | $Er_2O_3$ | 3 | 6   | 0    | GPB | <0.1 | 2.4  | >99 | 690 | R2S, RS |
| 2-3  | A | $Lu_2O_3$ | 3 | 6   | 0    | GPS | <0.1 | 0.7  | >99 | 760 | R2S, RS |
| 2-4  | A | $Y_2O_3$  | 3 | 6   | 0    | GPS | <0.1 | 2.7  | >99 | 700 | R2S, RB |
| 2-5  | A | $Dy_2O_3$ | 3 | 6   | 0    | GPS | <0.1 | 3.0  | >99 | 700 | R2S, RS |
| 2-6  | A | $Er_2O_3$ | 1 | 10  | 0    | GPS | <0.1 | 1.9  | >99 | 770 | R2S, SNO |
| 2-7  | B | $Yb_2O_3$ | 3 | 4.5 | 0    | GPS | 0.1  | 3.3  | >99 | 790 | Y, A |
| 2-8  | B | $Yb_2O_3$ | 5 | 10  | 0    | GPS | 0.1  | 3.6  | >99 | 750 | R2S, A |
| 2-9  | B | $Y_2O_3$  | 4 | 10  | 0    | GPS | 0.1  | 3.8  | >99 | 700 | R2S, SNO |
| 2-10 | B | $Y_2O_3$  | 4 | 10  | 1.0  | PLS | 1.1  | 4.2  | 98  | 730 | R2S, A |
| 2-11 | B | $Y_2O_3$  | 4 | 10  | 1.5  | PLS | 1.5  | 4.7  | >99 | 750 | R2S, A |
| 2-12 | B | $Y_2O_3$  | 4 | 10  | 2.0  | PLS | 1.9  | 5.0  | >99 | 790 | g |
| 2-*13| C | $Y_2O_3$  | 3 | 5   | 0    | PLS | 0.2  | 4.0  | 95  | 450 | Y, A |
| 2-*14| C | $Y_2O_3$  | 3 | 10  | 10.0 | PLS | 10.2 | 50.0 | 98  | 620 | g |
| 2-15 | C | $Y_2O_3$  | 3 | 6   | 0    | GPS | 0.1  | 3.0  | >99 | 680 | R2S, RS |
| 2-16 | C | $Lu_2O_3$ | 3 | 6   | 0    | GPS | 0.1  | 1.0  | >99 | 720 | R2S, RS |

Samples marked with * lie outside the scope of the invention.
Note:
Amount of Al is in the sintered product and as been reckoned is $Al_2O_3$. R2S is $RE_2Si_2O_7$, RS is $RE_2SiO_5$, SNO is $Si_2N_2O$, A is apatite, Y is YAM, g is glass (amorphous).

TABLE 4

| Sample No. | Starting $Si_3O_4$ | Additives $RE_2O_3$ | | $SiO_2$ | Amount of additive $Al_2O_3$ (wt %) | Sintering method | Amount of Al (wt %) | Dielectric loss factor $\times10^{-4}$ | Relative density (%) | Strength at room temp. (Mpa) | Crystalline phase |
|---|---|---|---|---|---|---|---|---|---|---|---|
| 2-17 | A | $Lu_2O_3$ | 1   | 10 | 0 | GPS | <0.1 | 0.6 | 98  | 880 | R2S |
| 2-18 | B | $Lu_2O_3$ | 1   | 10 | 0 | GPS | <0.1 | 1.8 | 98  | 780 | R2S |
| 2-19 | C | $Lu_2O_3$ | 1   | 10 | 0 | GPS | 0.2  | 3.6 | 97  | 670 | R2S |
| 2-20 | A | $Lu_2O_3$ | 3   | 4.5| 0 | GPS | <0.1 | 1.0 | >99 | 890 | Y, A |
| 2-21 | A | $Lu_2O_3$ | 3   | 10 | 0 | GPS | <0.1 | 0.5 | >99 | 850 | R2S, SNO |
| 2-22 | A | $Lu_2O_3$ | 3   | 15 | 0 | GPS | <0.1 | 0.5 | >99 | 830 | R2S, SNO |
| 2-23 | A | $Lu_2O_3$ $Yb_2O_3$ | 1.5 1.5 | 10 | 0 | GPS | <0.1 | 0.5 | >99 | 950 | R2S, SNO |
| 2-24 | A | $Lu_2O_3$ | 7   | 20 | 0 | GPS | <0.1 | 1.2 | >99 | 820 | R2S, SNO |
| 2-25 | A | $Lu_2O_3$ | 7   | 10 | 2 | PLS | 1.9  | 4.1 | >99 | 630 | R2S, SNO |
| 2-*26| A | $Lu_2O_3$ | 3   | 10 | 0 | PLS | <0.1 | 1.1 | 94  | 410 | SNO |
| 2-*27| B | $Lu_2O_3$ | 1   | 10 | 0 | PLS | <0.1 | 1.9 | 95  | 460 | SNO |

Samples marked with * lie outside the scope of the invention.
Note:
Amount of Al is in the sintered product and as been reckoned is $Al_2O_3$. R2S is $RE_2Si_2O_7$, RS is $RE_2SiO_5$, SNO id $Si_2N_2O$, A is apatite, Y is YAM, g is glass (amorphous).

In order to make sure the properties of the samples listed in Tables 3 and 4 as the introduction window, the present inventors have formed films on the introduction window of an ECR (electron cyclotron resonance) plasma CVD apparatus by using the samples listed in Tables 3 and 4, and have tested durability of the introduction window. The time until the plasma was stabilized in the reaction furnace was measured. After it was confirmed that the plasma was stabilized, the film was formed for a maximum of 50 hours, and the thickness of the deposited film was measured by SEM. A thermocouple was connected to the introduction window, and the apparatus was set to come into a halt when the temperature exceeded 70° C. to protect the apparatus. The results were as shown in Table 5.

TABLE 5

| Sample No. | Stabilizing time (min) | Time for depositing film (hours) | Thickness of film ($\mu$m) | Growing rate ($\mu$m/Hr) |
|---|---|---|---|---|
| 2-1 | 7 | 50 | 22 | 0.44 |
| 2-2 | 7 | 50 | 20 | 0.40 |
| 2-3 | 5 | 50 | 30 | 0.60 |
| 2-4 | 7 | 50 | 19 | 0.38 |
| 2-5 | 8 | 50 | 18 | 0.36 |
| 2-6 | 7 | 50 | 24 | 0.48 |
| 2-7 | 8 | 50 | 17 | 0.34 |
| 2-8 | 8 | 50 | 16 | 0.32 |
| 2-9 | 8 | 50 | 16 | 0.32 |
| 2-10 | 8 | 50 | 16 | 0.32 |
| 2-11 | 9 | 50 | 16 | 0.32 |
| 2-12 | 10 | 50 | 14 | 0.28 |
| 2-*13 | 10 | leaked for 30 hrs. | 10 | 0.33 |
| 2-*14 | stopped after 5 min. | — | — | — |
| 2-15 | 8 | 50 | 14 | 0.30 |
| 2-16 | 8 | 50 | 15 | 0.29 |
| 2-17 | 5 | 50 | 31 | 0.62 |
| 2-18 | 7 | 50 | 25 | 0.50 |
| 2-19 | 8 | 50 | 16 | 0.32 |
| 2-20 | 5 | 50 | 28 | 0.56 |
| 2-21 | 5 | 50 | 33 | 0.66 |
| 2-22 | 5 | 50 | 32 | 0.64 |
| 2-23 | 5 | 50 | 33 | 0.66 |
| 2-24 | 5 | 50 | 25 | 0.52 |
| 2-25 | 8 | 50 | 16 | 0.32 |
| 2-26 | 7 | leaked for 20 hrs. | 11 | 0.55 |
| 2-27 | 7 | leaked for 30 hrs. | 15 | 0.50 |

Samples marked with * lie outside the scope of the invention.

As will be obvious from Tables 3, 4 and 5, when a high-frequency transmitting window material of the present invention having a relative density of not smaller than 97% and a dielectric loss factor at 10 GHz of not larger than $5 \times 10^{-4}$ was used, the plasma was stabilized within short periods of time, and the film could be formed for more than 50 hours after the plasma was stabilized and the film-growing rate was fast.

When the amount of aluminum in the sintered product was not larger than 2% by weight reckoned as an oxide thereof, the dielectric loss factor of not larger than $5 \times 10^{-4}$ could be achieved. When the amount of aluminum was not larger than 0.5% by weight reckoned as an oxide, in particular, the dielectric loss factor was not larger than $4 \times 10^{-4}$ and when the amount of aluminum was smaller than 0.1% by weight, the dielectric loss factor was not larger than $3 \times 10^{-4}$. It will be also understood from Table 5 that the high-frequency introduction windows using these materials exhibit favorable properties.

When the dielectric loss factor was not smaller than $5 \times 10^{-4}$ (sample No. 2-14), on the other hand, the temperature of the window material rose very quickly and exceeded 70° C. in five minutes after the introduction of the plasma, and the apparatus came into a halt. When the relative density was not larger than 97% (samples Nos. 2-13, 2-26, 2-27 which are reference examples), the window material was cracked 20 to 30 hours after the formation of the film, and air-tightness for maintaining the vacuum decreased.

In order to compare the introduction window materials for their performance, furthermore, the inventors have further used a quartz glass and a sintered product of high-purity alumina having a purity of not smaller than 99% as windows for introducing microwaves, and have formed the films. The quartz glass contained $SiO_2$ in an amount of 99.9 mol % and exhibited a dielectric loss factor of $1 \times 10^{-4}$ and a strength at room temperature of not larger than 100 MPa. When this quartz glass was used, the time until the plasma was stabilized was 10 minutes, the temperature of the introduction window exceeded 70° C. after the film was formed for 35 hours, and the apparatus was brought into a halt. The thickness of the deposited film at this moment was 18 $\mu$m and the film-growing rate was 0.51 $\mu$m/Hr. The sintered product of alumina contained 0.5 mol % of $SiO_2$ and possessed a dielectric loss factor of $1 \times 10^{-4}$ and a mechanical strength at room temperature of 400 MPa. In a test for depositing films by using this sintered product of alumina, the window material of the sintered product of alumina cracked in 5 minutes after the introduction of the plasma, the air-tightness was decreased, and the film could not be deposited any more.

(Example 3)

The same starting materials A, B, C and sintering assistants as those of Example 1 were prepared and were weighed in amounts as shown in Table 6.

The predetermined amount of weighed powders were introduced into a 500-ml pot made of a polyethylene, and were mixed and pulverized in a rotary mill for 72 hours by using urethane balls and IPA (isopropanol) as an organic solvent together with a binder. The thus obtained slurry was then spray-dried to obtain a granulated powder. The powder was molded using a metal mold press under a molding pressure of 1 ton/cm$^2$ into an article having a diameter of 60 mm and a thickness of 4 mm. The molded article was dewaxed at 500° C. to obtain samples for sintering. The sintering was performed in nitrogen under a pressure of 9 atms. at 1750 to 1900° C. for 5 hours. (GPS method).

The obtained sintered products were subjected to the flat-surface grinding to obtain samples of a diameter of 48 mm and a thickness of 2 mm for measuring dielectric loss factors. The dielectric loss was measured by a cylindrical resonance measuring method at a resonance frequency of 10 GHz. Furthermore, the central portions of the sintered products were cut out, and the amounts of aluminum were measured from the ICP analysis and were reckoned as alumina ($Al_2O_3$). The relative densities were evaluated from theoretical density ratios calculated from the recipe compositions and the bulk densities measured by the Archimedes' method.

Next, onto the sintered products were deposited a variety of ceramic powders to a thickness of 50 to 70 $\mu$m by the reduced-pressure plasma melt-injection method. It was confirmed by the X-ray analysis that the films have all been crystallized.

To measure the resistance against the etching by plasma, the samples were introduced into a high-frequency plasma reactor so that the surfaces of the films were exposed to the high-frequency waves, and were subjected to the etching by plasma in a $CF_4/O_2$ mixture gas and in a $ClF_3/O_2$ mixture gas for 100 min. Changes in the thickness of samples were examined by using a micrometer. The results were as shown in Table 6.

TABLE 6

| Sample No. | Starting $Si_3N_4$ | Content (mol %) $RE_2O_3$ | | $SiO_2$ | Amount of Al (wt. %) | Relative density (%) | Kind of ceramic film | Dielectric factor $\times 10^{-4}$ | Etching rate CP | CIP |
|---|---|---|---|---|---|---|---|---|---|---|
| 3-1 | A | $Y_2O_3$ | 3.0 | 6.0 | <0.1 | 99 | $Al_2O_3$ | 0.6 | 20 | <10 |
| 3-2 | A | $Dy_2O_3$ | 3.0 | 6.0 | <0.1 | 99 | $Al_2O_3$ | 3.1 | 20 | <10 |
| 3-3 | A | $Br_2O_3$ | 3.0 | 6.0 | <0.1 | 99 | $Al_2O_3$ | 2.2 | 20 | <10 |
| 3-4 | A | $Tm_2O_3$ | 3.0 | 6.0 | <0.1 | 99 | $Al_2O_3$ | 2.1 | 20 | <10 |
| 3-5 | A | $Yb_2O_3$ | 3.0 | 6.0 | <0.1 | 99 | $Al_2O_3$ | 2.0 | 20 | <10 |
| 3-6 | A | $Lu_2O_3$ | 3.0 | 6.0 | <0.1 | 99 | $Al_2O_3$ | 0.6 | 20 | <10 |
| 3-7 | B | $Lu_2O_3$ | 3.0 | 6.0 | 0.1 | 98 | $Al_2O_3$ | 2.0 | 20 | <10 |
| 3-8 | C | $Lu_2O_3$ | 3.0 | 6.0 | 0.2 | 98 | $Al_2O_3$ | 3.3 | 20 | <10 |
| 3-9 | A | $Lu_2O_3$ | 3.0 | 6.0 | 1.0 | 99 | $Al_2O_3$ | 2.5 | 20 | <10 |
| 3-10 | A | $Lu_2O_3$ | 3.0 | 8.0 | 2.0 | 99 | $Al_2O_3$ | 4.0 | 20 | <10 |
| 3-*11 | A | $Lu_2O_3$ | 3.0 | 6.0 | 3.0 | 99 | $Al_2O_3$ | 12.0 | 20 | <10 |
| 3-*12 | A | $Y_2O_3$ | 3.0 | 10.0 | 2.5 | 99 | $Al_2O_3$ | 6.0 | 20 | <10 |
| 3-*13 | B | $Y_2O_3$ | 3.0 | 10.0 | 2.5 | 99 | $Al_2O_3$ | 7.2 | 20 | 10 |
| 3-*14 | C | $Y_2O_3$ | 3.0 | 10.0 | 2.5 | 99 | $Al_2O_3$ | 9.8 | 20 | <10 |
| 3-15 | A | $Lu_2O_3$ | 2.0 | 6.0 | <0.1 | 98 | $Al_2O_3$ | 1.2 | 20 | <10 |
| 3-16 | A | $Lu_2O_3$ | 1.5 | 6.0 | <0.1 | 97 | $Al_2O_3$ | 2.5 | 20 | <10 |
| 3-*17 | A | $Lu_2O_3$ | 1.0 | 10.0 | <0.1 | 95 | $Al_2O_3$ | 6.0 | 20 | <10 |
| 3-**18 | A | $Lu_2O_3$ | 3.0 | 6.0 | <0.1 | 99 | — | 0.6 | 120 | 110 |
| 3-19 | A | $Lu_2O_3$ | 3.0 | 6.0 | <0.1 | 99 | AlN | 0.8 | 35 | 15 |
| 3-20 | A | $Lu_2O_3$ | 3.0 | 6.0 | <0.1 | 99 | $ZrO_2$ | 0.6 | 50 | 20 |
| 3-**21 | A | $Lu_2O_3$ | 3.0 | 6.0 | <0.1 | 99 | $SiO_3$ | 0.6 | 200 | 150 |
| 3-**22 | A | $Lu_2O_3$ | 3.0 | 6.0 | <0.1 | 99 | $ZrO_2$ | 0.6 | 150 | 100 |

Samples marked with * lie outside the scope of the invention.
Samples marked with ** are reference examples.

As will be obvious from the results of Table 6, the samples Nos. 3-11 to 3-14 in which the amount of aluminum was not smaller than 2% by weight in the board of the sintered product of silicon nitride all exhibited dielectric loss factors of not smaller than $5\times10^{-4}$. It will therefore be understood that controlling the amount of aluminum is important for decreasing the dielectric loss factor.

The sample No. 3-18 that was satisfactory as the board but was not coated with the ceramic film, was etched by plasma to a large degree. On the other hand, the dielectric material of the present invention coated with alumina, aluminum nitride or zirconia was etched by an amount as small as 50 nm/min. or less by the CF plasma and by an amount as small as 20 nm/min. or less by the CIF plasma. Among the ceramic films, however, silica and zircon permitted the dielectric material to be etched to a large extent and were inferior in regard to resistance against the plasma.

We claim:

1. A window for transmitting a high-frequency wave, comprising:
    a molded article further comprising sintered silicon nitride, the sintered silicon nitride containing $SiO_2$ and a compound of an element of Group 3A of the periodic table, wherein the sintered silicon nitride has an aluminum content that is suppressed to not larger than 0.5% by weight calculated as $Al_2O_3$, and the sintered nitride has a relative density of not less than 97% and a dielectric loss factor at 10 GHz of not larger than $4\times10^{-4}$.

2. The window of claim 1, wherein the aluminum content is suppressed to not larger than 0.1% by weight calculated as $Al_2O_3$, and the sintered silicon nitride has a dielectric loss factor at 10 GHz of not larger than $3\times10^{-4}$.

3. The window of claim 1, wherein the sintered silicon nitride contains a compound of an element (RE) of Group 3A of the periodic table in an amount not larger than 10 mol % calculated as an oxide thereof ($RE_2O_3$).

4. The window of claim 3, wherein the $SiO_2$ content of the sintered silicon nitride is 1.5 to 10 in terms of a molar ratio ($SiO_2/RE_2O_3$).

5. A window for transmitting a high frequency wave, comprising:
    a molded article further comprising sintered silicon nitride, the sintered silicon nitride containing $SiO_2$ and a compound of an element of Group 3A of the periodic table, wherein the sintered silicon nitride has an aluminum content that is suppressed to not larger than 0.5% by weight calculated as $Al_2O_3$, and the sintered nitride has a relative density of not less than 97% and a dielectric loss factor at 10 GHz of not larger than $4\times10^{-4}$;
    wherein the molded article has at least one surface coated with at least one ceramic film selected from the group consisting of alumina, aluminum nitride and zironcia.

* * * * *